United States Patent [19]

Baerg et al.

[11] Patent Number: 4,654,958
[45] Date of Patent: Apr. 7, 1987

[54] PROCESS FOR FORMING ISOLATED SILICON REGIONS AND FIELD-EFFECT DEVICES ON A SILICON SUBSTRATE

[75] Inventors: William Baerg, Palo Alto; Chiu H. Ting, Saratoga; Terence T. Hwa, Santa Clara, all of Calif.

[73] Assignee: Intel Corporation, Santa Clara, Calif.

[21] Appl. No.: 700,607

[22] Filed: Feb. 11, 1985

[51] Int. Cl.[4] .......................................... H01L 21/477
[52] U.S. Cl. ..................... 29/571; 29/576 E; 148/1.5; 148/171
[58] Field of Search ............... 148/1.5, 171; 29/576 E, 29/571

[56] References Cited

U.S. PATENT DOCUMENTS

| | | | |
|---|---|---|---|
| 4,269,631 | 5/1981 | Anantha et al. | 148/1.5 |
| 4,381,201 | 4/1983 | Sakurai | 148/1.5 |
| 4,381,202 | 4/1983 | Mori et al. | 148/1.5 |
| 4,487,639 | 12/1984 | Lam et al. | 148/175 |
| 4,497,683 | 2/1985 | Celler et al. | 29/576 E X |
| 4,498,226 | 2/1985 | Inoue | 29/576 B |
| 4,566,914 | 1/1986 | Hall | 29/576 E X |

FOREIGN PATENT DOCUMENTS 2104723 3/1983 United Kingdom .
2120011 11/1983 United Kingdom .

*Primary Examiner*—George T. Ozaki
*Attorney, Agent, or Firm*—Blakeley, Sokoloff, Taylor & Zafman

[57] ABSTRACT

Improved processing for MOS and CMOS transistors formed in an epitaxial-like layer. Field oxide regions are formed followed by the deposition of a polycrystalline or amorphous silicon layer which contacts the substrate at "seed windows" formed between the field oxide regions. The silicon layer is recrystallized from the substrate through the seed windows. The transistors are fabricated within the recrystallized silicon layer.

16 Claims, 10 Drawing Figures

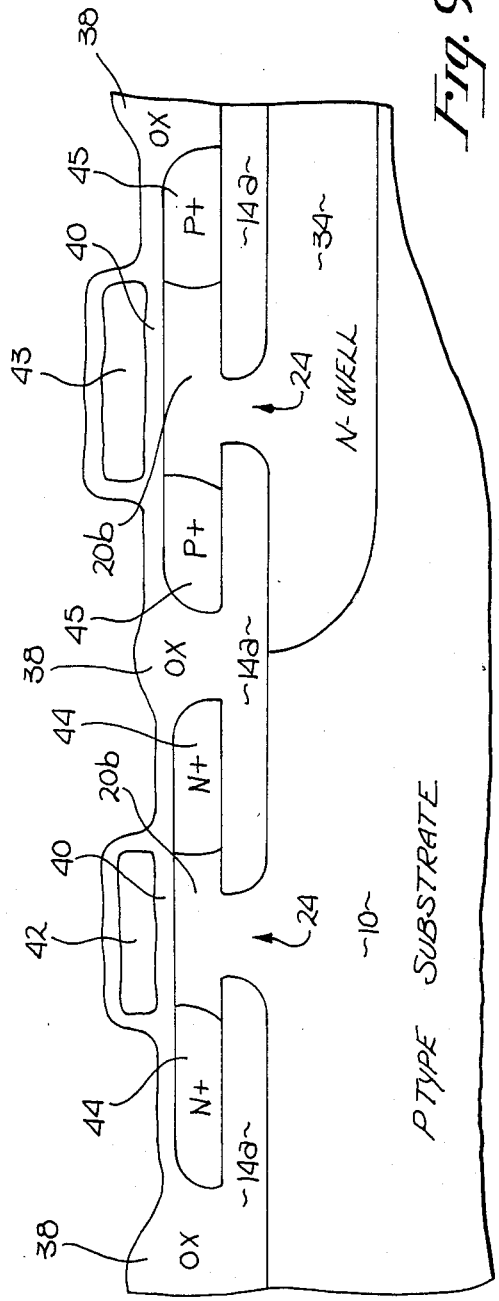
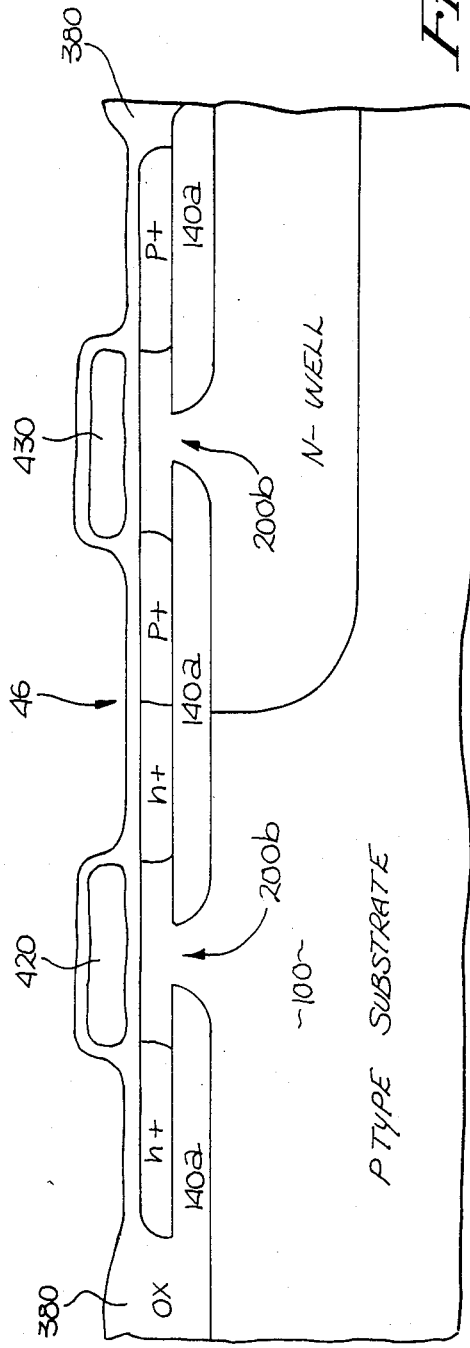

PROCESS FOR FORMING ISOLATED SILICON REGIONS AND FIELD-EFFECT DEVICES ON A SILICON SUBSTRATE

BACKGROUND OF THE INVENTION

1. Field of the Invention

The invention relates to the field of MOS integrated circuits, particularly the forming of isolated silicon regions on a silicon substrate.

2. Prior Art

In the fabrication of metal-oxide-semiconductor (MOS) integrated circuits, steps are often taken to electrically isolate one device from another to eliminate or reduce parasitic paths between devices. If, for instance, field-effect transistors are fabricated on a silicon substrate without isolation, source or drain regions from two different transistors may act as an unwanted third transistor. Overlying interconnections such as aluminum lines disposed between the source of one transistor and the drain of another transistor, acts as a gate and can cause parasitic conduction.

Parasitic paths are even a greater problem in complementary MOS (CMOS) integrated circuits. There, the substrate, n+ or p+ regions of complementary transistors and the wells in which transistors of one conductivity type are formed can together form an unwanted transistor. Transistor action between these various regions can result in a parasitic path which destroys an integrated circuit. This problem is sometimes referred to as "latch-up".

Several processing techniques are currently used to reduce parasitic conduction. Field oxide regions are commonly used between adjacent transistors to isolate, for instance, the source of one transistor from the drain of another. These thicker oxides provide a less conductive path (a longer path) between adjacent transistors, and moreover, overlying lines are at a greater distance from the substrate decreasing their effectiveness as unwanted gates. A typical n+ to p+ field oxide is 6 microns in width for CMOS circuits, and thus, consumes a considerably amount of substrate area when compared to the area required to fabricate the field-effect transistor. In other cases, trenches are formed in the substrate and filled with an insulative material. This technique requires more complex processing, although it is effective, even with spacing as low as 1 micron.

Other techniques are also used in CMOS circuits to prevent latch up. For example, the circuits are formed in an epitaxial layer which layer is grown on a highly doped substrate. In other circuits, a thin layer is formed over an insulator such as in the silicon-on-sapphire (SOS) technology.

The present invention provides a departure from the prior art techniques described above. In the present invention, the crystalline structure of the substrate is used as a seed for the growth of an epitaxial-like layer formed over isolation regions.

Other processes for forming epitaxial-like layers from seeds are known. In general, these prior art processes use a single seed, do not fabricate devices on the seed window, or do not have electrical participation of the substrate in the final circuit. The closest prior art known to Applicant is: (1) *Electronic Week*, Aug. 6, 1984, page 31, "Britain Getting Its Act Together In SOI Technology In Bid To Get Jump On U.S. And Japanese Chip Makers"; (2) *Electronic Week*, Aug. 6, 1984, Pages 32–33, "Cambridge Lab Heats Wafers Top and Bottom"; (3) IEDM82, 16.4, Pages 433–436, Warabisako et al., "Characterization of Laser-SOI Double Si Active Layers By Fabricating Elementary Device Structures"; (4) IEDM82 16.1, Pages 420–423, T. I. Kamins "MOS Transistors in Beam-Recrystallized Polysilicon"; (5) *J.Electrochem.Soc.* September 1981, Pages 1981–1986 (Vol. 128, No. 9), Lam et al., "Single Crystal Silicon-On-Oxide By A Scanning CW Laser Induced Lateral Seeding Process"; (6) IEDM84 34.5, Pages 808–811, Herre et al., "Device Performances of A Submicron SOI Technology"; and (7) *Journal of Crystal Growth* 63, 1983, pages 453–483, Fan et al., "Graphite-Strip-Heater-Zone-Melting Recrystallization of Si Films".

SUMMARY OF THE INVENTION

Improved processing is described for the fabrication of field-effect devices on a silicon substrate where insulative regions are used to isolate the devices from one another. The insulative regions are formed on the substrate and define openings between these regions; these regions provide "seed windows" to the substrate. A layer of silicon (e.g., polysilicon or amorphous silicon) is formed over the insulative regions and extends into the windows. This layer is subjected to a treatment which causes the crystalline structure of the substrate to grow into the layer of silicon through the seed windows. The recrystallization of the layer of silicon is seeded through the windows. The recrystallized layer of silicon forms a host layer into which and on which field-effect devices may be fabricated with the channel regions of the devices being formed directly over the seed windows.

BRIEF DESCRIPTION OF THE DRAWINGS

FIG. 9 illustrates the substrate of FIG. 8 after CMOS transistors have been fabricated on and in the upper silicon layer.

FIG. 10 is a cross sectional elevation of a substrate illustrating an alternate embodiment of the present invention particularly useful for the fabrication of a CMOS inverter.

DETAILED DESCRIPTION OF THE PRESENT INVENTION

A process for forming isolatd regions and field-effect devices on a silicon substrate, is described. In the following description, numerous specific details are set forth to provide a thorough understanding of the present invention. It will be obvious to one skilled in the art that the process may be practiced without these specific details. In other instances, well-known processing steps have not been described in detail in order not to unnecessarily obscure the present invention.

FIGS. 1-9 illustrate the fabrication of complementary MOS field-effect devices (particularly field-effect transistors) employing the teachings of the present invention. The fabrication begins with an ordinary p-type monocrystalline silicon substrate 10 illustrated in FIG. 1. An n-type well 34 for the p-channel devices is formed in the substrate using well-known processing. Arsenic, phosphorus or other n-type dopants may be used for this well. A protective layer 12 such as a silicon dioxide layer is disposed on the upper surface of the substrate 10. Silicon nitride members 13 are formed using ordinary masking and etching steps. These members are spaced apart from one another as illustrated with one member being formed over the well 34. The width of these members is not critical to the present invention; for instance, they can be in the order of a micron or less.

Figure 1:
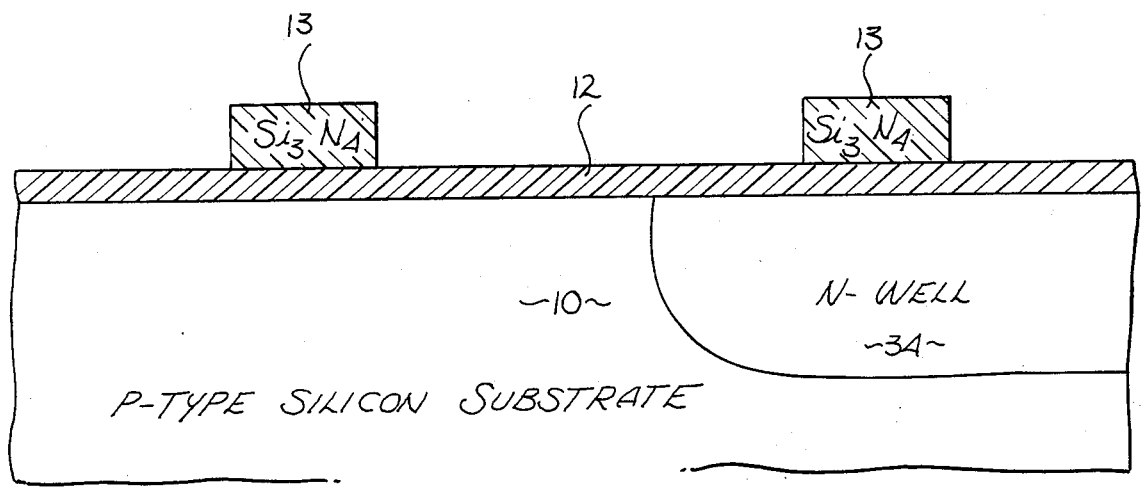
FIG. 1 is a cross sectional elevation view of a portion of a silicon substrate which includes an n-type well, a silicon dioxide layer and silicon nitride masking members.
Figure 2:
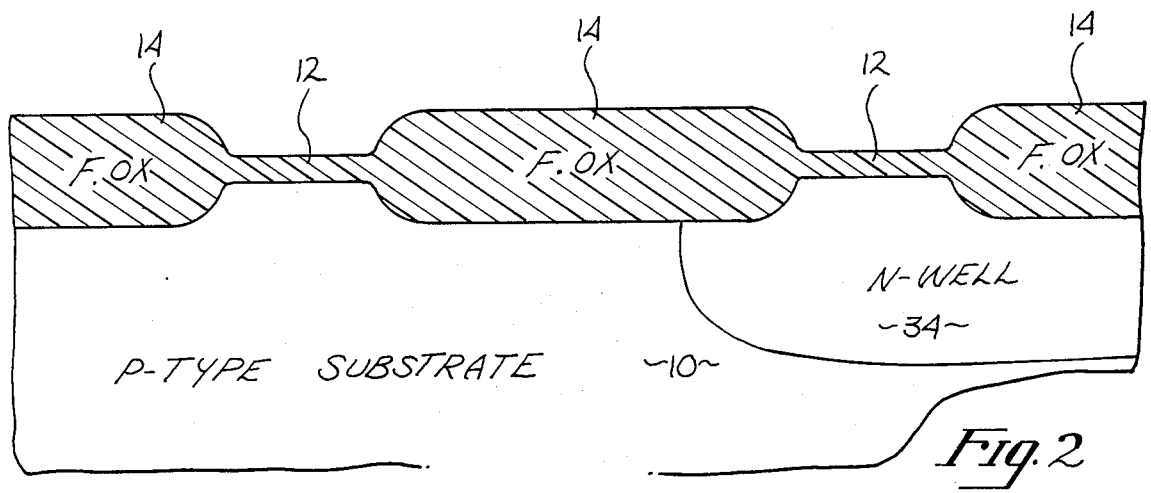
FIG. 2 illustrates the substrate of FIG. 1 after an oxidation step and after the silicon nitride masking members have been removed.

The substrate of FIG. 1 is subjected to a high temperature oxidation step as is commonly employed to form the field oxide regions 14 shown in FIG. 2. (This step may also be used as a "drive" step to form well 34.) The thickness of the field oxide regions 14 may, for example, be 6000A.

Figure 3:
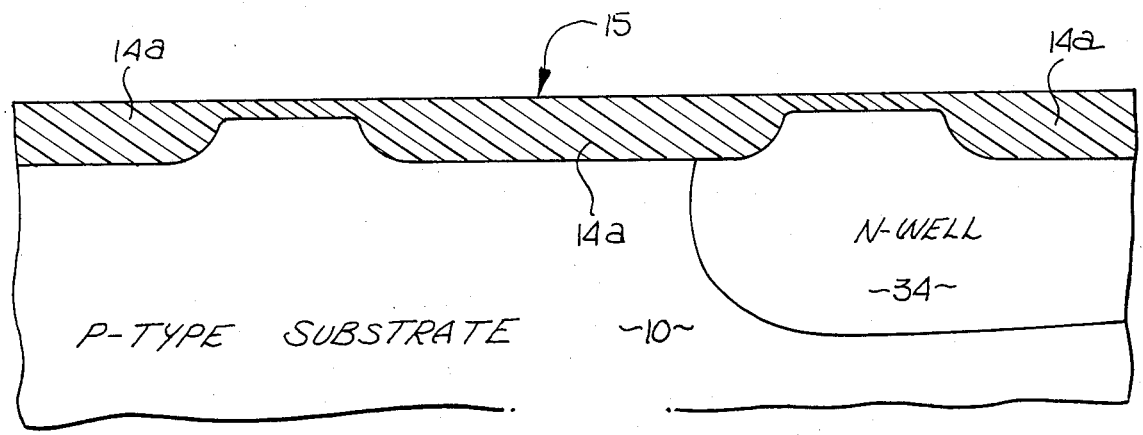
FIG. 3 illustrates the substrate of FIG. 2 after a planarization step.

While not necessary, but preferred, the structure of FIG. 2 is planarized. That is, steps are used to form a planar surface 15 shown in FIG. 3. Known processing can be used for this planarization. For instance, a planar coating of polymethymethacrylate or a spin-on-glass layer may be formed over the structure of FIG. 2 to form a planar layer. Then this planar layer is subjected to a reactive ion etch which has a 1-1 selectivity between the layer and field oxide regions 14. The field oxide regions 14 of FIG. 2 are reduced in thickness and are shown in FIG. 3 as field oxide regions 14a.

Figure 4:
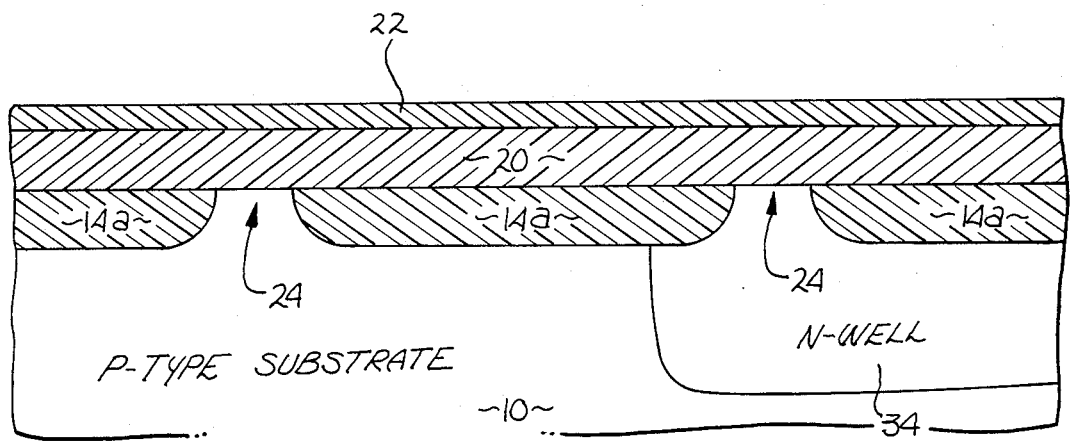
FIG. 4 illustrates the substrate of FIG. 3 after the formation of a silicon layer on the substrate.

Now a hydrofluoric acid dip is used to expose the silicon substrate between the field oxide regions 14a followed by the deposition of a polysilicon or amorphous silicon layer 20 over the substrate, such deposition being well known in the prior art. This layer of silicon covers both the exposed regions of the silicon substrate and field oxide regions 14a. As shown in FIG. 4, the upper silicon layer 20 contacts the substrate 10 at the windows or openings 24. That is, the regions 14a define openings to the substrate 10. A layer of silicon dioxide or silicon dioxide/silicon nitride composite layer 22 is formed over the upper silicon layer 20. The upper silicon layer 20 and overlying layer 22 may be formed using well known chemical vapor deposition steps. In the presently preferred embodiment, layer 20 is approximately 5000A thick and the overlying layer may be, for instance, 1000A thick.

Figure 5:
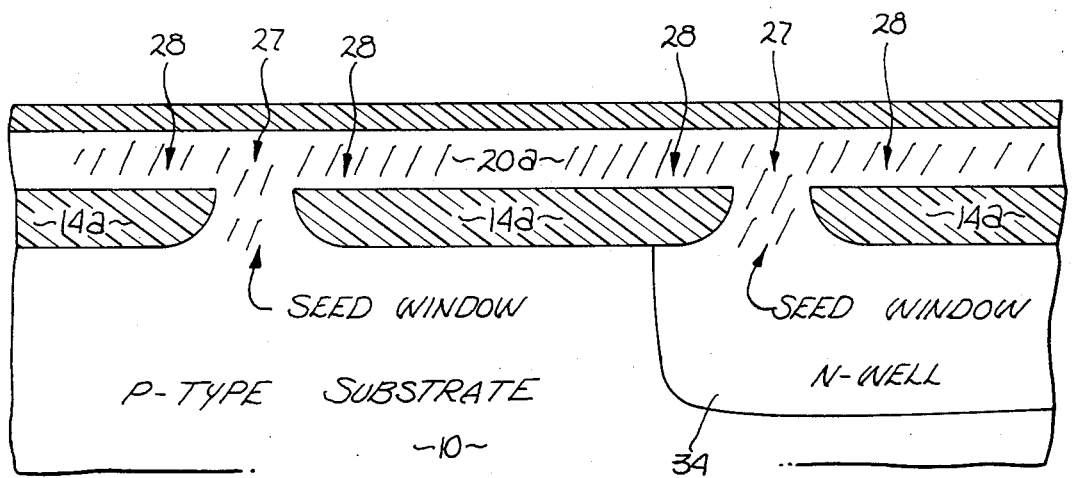
FIG. 5 illustrates the substrate of FIG. 4 after the crystalline structure of the substrate has propagated into the upper silicon layer.
Figure 6:
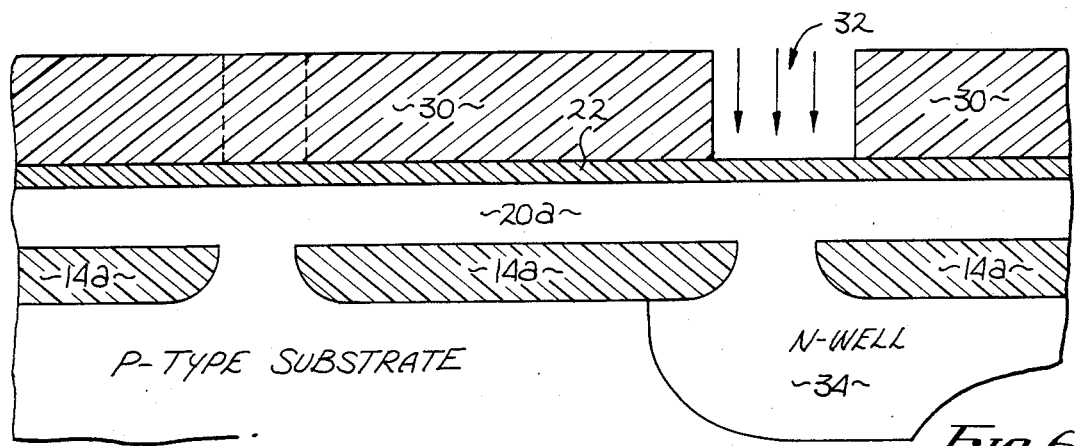
FIG. 6 illustrates the substrate of FIG. 5 during doping steps used to adjust voltage thresholds for the devices.

Now the upper silicon layer 20 is recrystallized causing layer 20 to take on the crystalline structure of the substrate. That is, if the substrate has a crystalline orientation of (100) the polysilicon or amorphous silicon of layer 20 takes on the (100) crystal orientation of the structure. This recrystallization can be accomplished by subjecting the structure of FIG. 4 to heat from such sources as a scanning laser (e.g., CW argon laser), scanning electron beam or graphite strip heater. The recrystallized layer 20 of FIG. 4 is shown in FIG. 5 as layer 20a. The openings 24 of FIG. 4 act as seed windows allowing the crystalline structure of the substrate to propagate or grow into the layer 20 through the seed windows. The silicon of layer 20 directly above the seed windows shown by arrows 27 in FIG. 5 has the highest quality monocrystalline structure since it is directly above the silicon substrate. However, the crystalline structure of the substrate propagates laterally into the silicon layer above the oxide regions 14a to the regions identified by the arrows 28 of FIG. 5. This lateral recrystallization, for instance, will occur for a distance of several microns beyond the edges of the seed windows, although the quality of the resultant crystal structure may not be as good as that occurring above the seed windows. The layer 20a therefore is in the nature of an epitaxial silicon layer with the crystal growth occurring from the predetermined seed windows which are separated by field oxide regions. It is the layer 20a on which and into which the field-effect devices are fabricated.

Various other methods may be used to heat the back of the substrate during recrystallization. For instance, a hot chuck may be used to hold the wafer at an elevated temperature during recrystallization, or a quartz furnace may be used for this purpose.

A masking layer 30 is formed with an opening 32 defined through the layer 30 above selected seed windows. An n-type dopant such as phosphorus or arsenic is now introduced through the layer 20a. This dopant may be diffused into layer 20a where layer 22 is first etched at opening 32 of the dopant may be ion implanted through layer 22. The dopant is used to adjust the threshold voltage of the n-channel devices as is well-known. Another masking step is used to form an opening (shown in dotted lines in layer 30 of FIG. 6) to permit threshold voltage adjusting for the p-channel devices.

Figure 7:
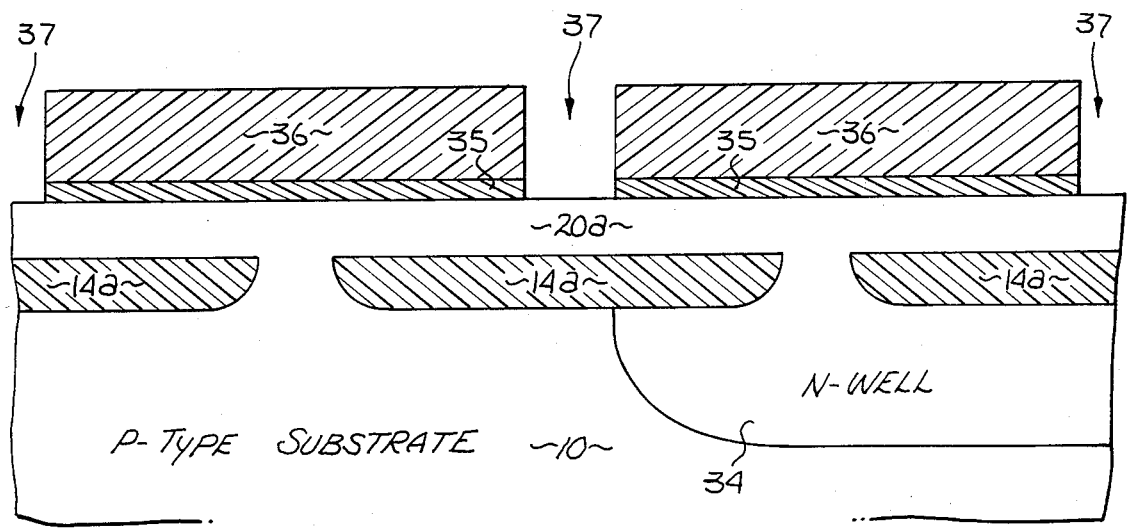
FIG. 7 illustrates the substrate of FIG. 6 after an additional masking step.

The next processing steps are used to define separate regions or pattern the recrystallized silicon layer 20. The layer 22 of FIG. 6 may be used for this patterning, or if this layer is removed, another layer 35 of silicon dioxide or silicon nitride may be employed as shown in FIG. 7. (Silicon nitride is currently preferred.) Masking members 36 are used to define the openings 37 through layer 35. Local oxidation is used to form oxide regions 38 of FIG. 8. A combination of reactive ion etching or local oxidation may be used or etching alone may be used to remove layer 20a at openings 37. Most any prior art masking materials may be used for masking members 30 and 36, as well as, implementation of prior art masking methods for masking and defining openings 32 and 37.

Figure 8:
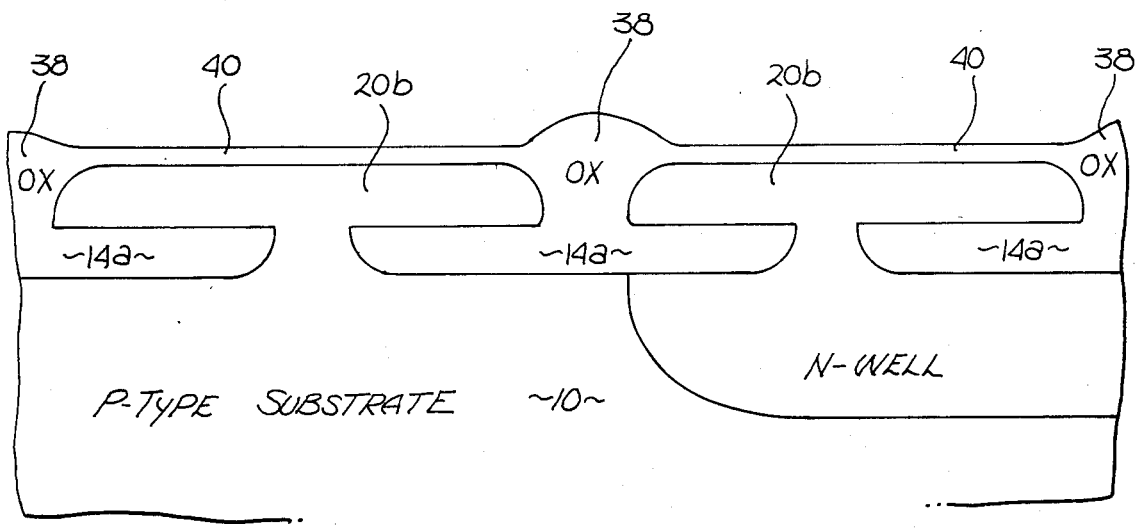
FIG. 8 illustrates the substrate of FIG. 7 after the silicon layer has been processed to isolate two adjacent transistor regions.

The resultant structure is shown in FIG. 8 with regions 20b of recrystallized silicon separated from one another by oxide 38. Note that the silicon regions 20b are electrically isolated from one another above the oxide regions 14a and additionally the path through the silicon substrate between these regions 20b (through the seed windows) is relatively long. A high quality gate oxide 40 may be grown on the regions 20b as shown in FIG. 8. If etching is used the regions 20b are also isolated from one another.

Next, a polycrystalline silicon layer is formed over the structure of FIG. 8 and patterned to define gate members 42 and 43 shown in FIG. 9. Two doping steps are next used to form source and drain regions 44 and source and drain regions 45. As is well-known, for example, first the areas of the p-channel devices are covered with a photoresist while an n-type dopant is introduced in alignment with the gate 42 to form the source and drain regions 44. Then, while the n-channel devices are covered, a p-type dopant is introduced in alignment with the gate 43 to form the source and drain regions 45. Ordinary, well known passivation layers (not shown) and metallization layers may now be formed to complete the transistors of FIG. 9.

In FIG. 10, an alternate embodiment to the structure of FIG. 9 is illustrated. Like regions of FIG. 9 have been shown by the same number in FIG. 10 with the addition of a zero to the number. For instance, in FIG. 10, field-effect devices are shown fabricated on a substrate 100, the n-channel device having a gate 420 and the p-channel device a gate 430. The processing for the devices of FIG. 10 is substantially the same as described for FIGS. 1-9 above, except the recrystallized silicon regions 200b are not isolated into separate regions at the area indicated by arrow 46 in FIG. 10. (This, for example, requires the elimination of the centermost opening 37 shown through the masking layer 36 of FIG. 7.) With the structure of FIG. 10, one of the source or drain regions of the n-channel device is in contact with one of the source or drain regions of the p-channel device. This provides a common junction between these transistors which is particularly useful in the fabrication of a CMOS inverter. (Note a metal shunt is used to connect these regions.)

There are several advantages to the integrated circuits shown in FIGS. 9 and 10 when compared to circuits using prior art isolation. Note that, for example, in FIG. 9 the n+ region 44 closest to the p+ region 45 is totally isolated from one another above the oxide region 14a. Thus, the spacing of these regions can be as close as masking tolerances will permit without fear of punch-through. The path between these regions through the window in the substrate and under the oxide regions 14a is relatively long (e.g., 3 microns) and is therefore too long to provide a problem. As mentioned, the highest quality recrystallization occurs at the seed windows 24 of FIG. 9. This higher quality silicon is at the channels of the transistors where it is most needed. The poorer recrystallization located towards the outer edges of the source and drain regions is of less concern in these regions than it would be if it occurred in the channel regions. With the circuits of Figures 9 and 10, the devices are in contact with the underlying substrate (both inside and outside the well 34 and 340). This permits better control of substrate leakage currents from hot electrons. Moreover, there is low junction capacitance and junction leakage since the source and drain junctions are mostly located over the oxide regions 14a. Contact leakage (e.g., from metal contacts) to the substrate is much easier than with prior art structures since contacts can be made to the source and drain regions above the oxide regions 14a or 140a. Diffusion plugs often used in the prior art to prevent "spiking" are therefore not needed.

Thus, improved processing has been described for preparing a silicon substrate on which field-effect transistors are to be fabricated. Spaced apart, recrystallized silicon regions are formed over oxide regions. The recrystallization occurs from seed windows formed between the oxide regions. Field-effect devices are formed over the seed windows.

We claim:

1. In the fabrication of field-effect devices on a silicon substrate where insulative regions are used to isolate said devices from one another, improved processing comprising the steps of:
   forming an insulative layer on said substrate so as to define windows between regions of said insulative layer;
   etching said insulative layer to expose said substrate at said windows;
   forming a silicon layer over said insulative regions and windows;
   subjecting said layer of silicon to a treatment which causes recrystallization of said silicon layer, said recrystallization occurring by crystal growth from said substrate expanding into said silicon layer through said windows and further expanding laterally in said silicon layer disposed above said insulative regions;
   forming a gate, wherein said gate is disposed above said windows;
   doping regions of said silicon layer disposed above said insulative layer to form drain and source regions;
   whereby source and drain regions are isolated from said substrate by said insulative layer;

2. The process defined by claim 1 including the additional step of defining isolated regions in said recrystallized layer of silicon, such that each of said devices is isolated from one another within said recrystallized layer.

3. The process defined by claim 2 wherein the channels of said devices lie generally over said windows.

4. The process defined by claim 1 wherein said silicon substrate is a monocrystalline silicon and wherein said recrystallized layer of silicon takes on the crystal orientation of said substrate so as to form an epitaxial-like upper silicon layer.

5. The process defined by claim 4 wherein said step of forming said layer of silicon comprises the step of forming a layer of polysilicon.

6. The process defined by claim 4 wherein said step of forming a layer of silicon comprises the step of forming a layer of amorphous silicon.

7. The process defined by claim 1 wherein said insulative regions are silicon dioxide regions grown from said substrate.

8. The process defined by claim 7 including the step of planarizing said grown silicon dioxide regions prior to said step of forming said layer of silicon.

9. The process defined by claim 1 wherein said step of subjecting said layer of silicon to treatment to form said recrystallized silicon, comprises the heating of said layer of silicon.

10. A process for fabricating field-effect transistors (FETs) on a silicon substrate, comprising the steps of:
    forming an oxide layer on said substrate so as to define windows between regions of said oxide layer;
    etching said oxide layer to expose said sbustrate at said windows;
    forming a silicon layer over said oxide regions and windows, said silicon layer contacting said substrate between said spaced apart oxide regions;
    forming a silicon composite layer over said silicon layer;
    subjecting said silicon layer to a treatment which causes recrystallization of said silicon layer such that said silicon layer takes on the crystalline structure of said substrate, said recrystallization occurring by crystal growth from said substrate expanding into said silicon layer through said windows and further expanding laterally in said silicon layer disposed above said oxide regions;

forming gates, wherein each of said gates is disposed above each of said windows;

doping regions of said silicon layer disposed above said first oxide layer to form drain and source regions of said FETs;

whereby source and drain regions are isolated from said substrate by said oxide layer.

11. The process defined by claim 10 wherein said step of forming said silicon layer comprises the formation of a polysilicon layer.

12. The process defined by claim 10 wherein said step of forming said silicon layer comprises the step of forming an amorphous silicon layer.

13. The process defined by claims 11 or 12 wherein said step of forming spaced apart oxide regions comprises the step of growing oxide regions from said substrate.

14. The process defined by claim 13 wherein said step of subjecting said silicon layer to a treatment which causes said recrystallization includes the heating of said silicon layer.

15. The process defined by claim 14 where prior to the formation of said silicon layer, said oxide regions are planarized.

16. The process defined by claim 10 including steps to form isolated regions in said recrystallized silicon layer by removing portions of said silicon layer above said oxide region, permitting a second oxide layer to grow into said vacated portion such that said second oxide layer contacts said first oxide layer, wherein drains and sources of each FET are isolated from drains and sources of other FETs by said oxide layers.

* * * * *